United States Patent
Contaldo et al.

(10) Patent No.: US 9,291,478 B2
(45) Date of Patent: Mar. 22, 2016

(54) MAGNETIC FIELD SENSOR WITH IMPROVED SENSITIVITY TO MAGNETIC FIELDS

(75) Inventors: Mauricio Contaldo, Buenos Aires (AR); Gregory Szczeszynski, Hollis, NH (US); Gerardo A. Monreal, Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 613 days.

(21) Appl. No.: 13/484,640

(22) Filed: May 31, 2012

(65) Prior Publication Data

US 2013/0320941 A1 Dec. 5, 2013

(51) Int. Cl.
G01R 33/00 (2006.01)
G01D 5/14 (2006.01)
G01R 33/07 (2006.01)

(52) U.S. Cl.
CPC .............. *G01D 5/145* (2013.01); *G01R 33/07* (2013.01); *G01R 33/0005* (2013.01)

(58) Field of Classification Search
CPC .... G01R 33/07; G01R 33/077; G01R 33/075; H02M 2007/2195; H02M 3/33507; H02M 7/219; H02P 2101/45; H02P 9/305; H02P 9/48
See application file for complete search history.

(56) References Cited

U.S. PATENT DOCUMENTS

| | | | | |
|---|---|---|---|---|
| 5,548,464 A | * | 8/1996 | Manning | H02H 1/06 361/18 |
| 5,998,980 A | * | 12/1999 | Schieke | H02M 7/219 323/276 |
| 7,388,560 B2 | | 6/2008 | Yamamoto et al. | |
| 7,501,882 B2 | | 3/2009 | Rasaratnam | |
| 7,786,712 B2 | | 8/2010 | Williams | |
| 7,923,865 B2 | | 4/2011 | Melse | |
| 7,960,955 B2 | | 6/2011 | Ito et al. | |
| 2009/0121707 A1 | * | 5/2009 | Schott | G01R 33/0005 324/207.2 |
| 2010/0164491 A1 | * | 7/2010 | Kejik | G01R 33/077 324/251 |
| 2012/0176820 A1 | * | 7/2012 | Li | H02M 3/33507 363/21.12 |
| 2013/0100710 A1 | * | 4/2013 | Kang | H02H 9/04 363/21.12 |

OTHER PUBLICATIONS

U.S. Appl. No. 14/831,958, filed Aug. 21, 2015, Vijay Mangtani, et al.
Melexis MLX 90324; ""Under-the-Hood" Triaxis Rotary Position feat. SENT Protocol;" 3901090324 Data Sheet; Dec. 2008; 40 pages.

* cited by examiner

*Primary Examiner* — Adolf Berhane
*Assistant Examiner* — Henry Lee, III
(74) *Attorney, Agent, or Firm* — Daly, Crowley, Mofford & Durkee, LLP

(57) ABSTRACT

A magnetic field sensor has internal power supply generating circuits to generate a higher operating voltage for a magnetic field sensing element, resulting in a magnetic field sensor with improved sensitivity to magnetic fields.

41 Claims, 9 Drawing Sheets

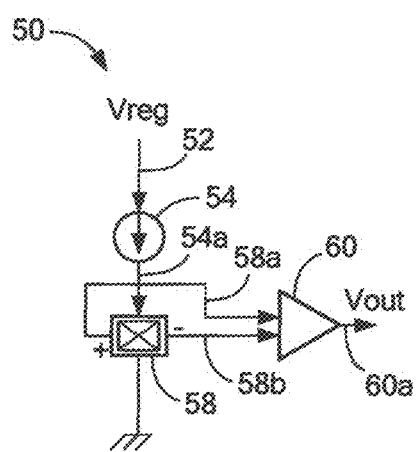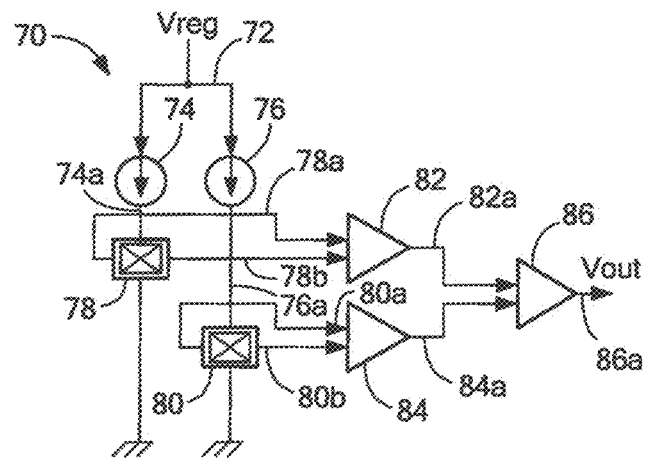
*FIG. 2*            *FIG. 3*
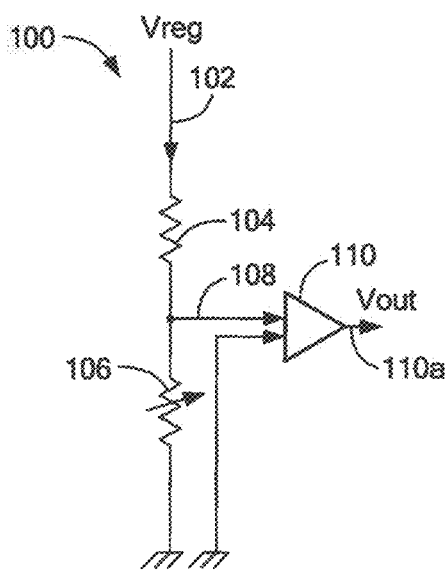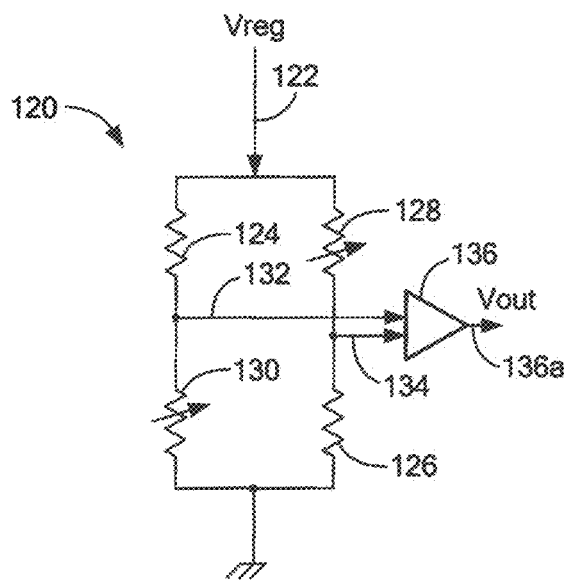
*FIG. 4*            *FIG. 5*

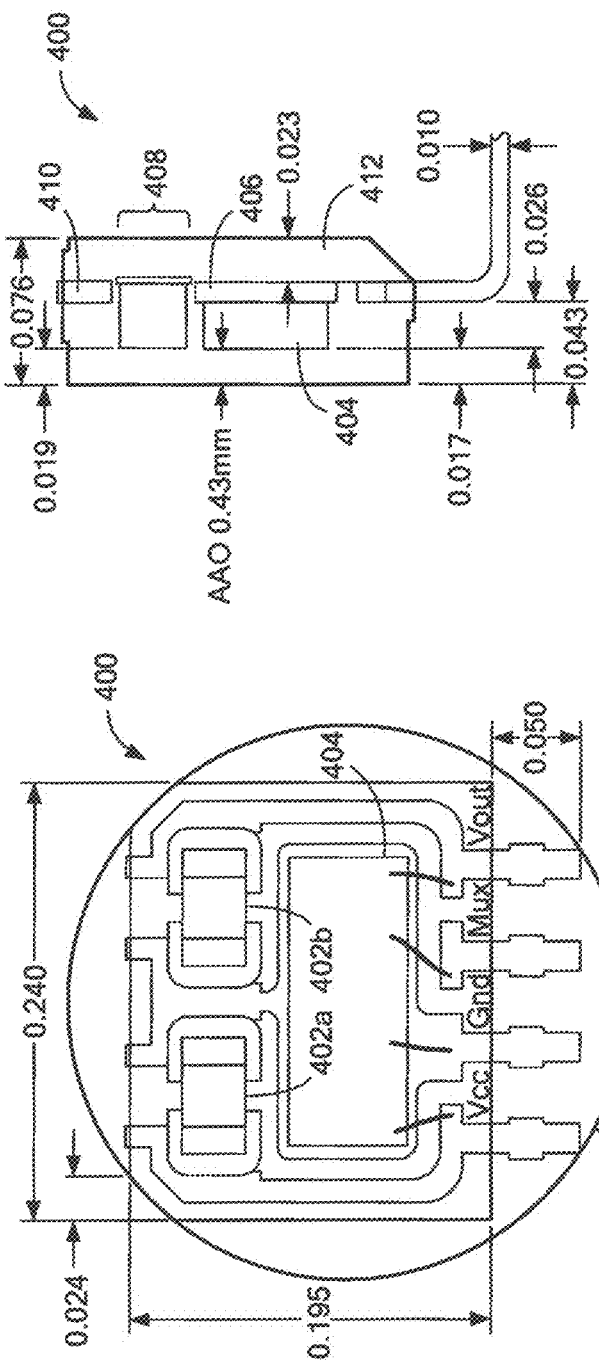
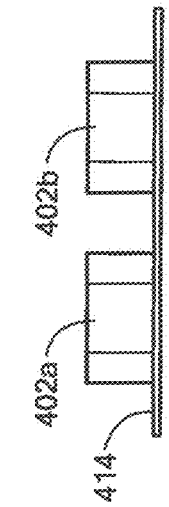

MAGNETIC FIELD SENSOR WITH IMPROVED SENSITIVITY TO MAGNETIC FIELDS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors having internal power supply arrangements that allow better sensitivity to magnetic fields even in the presence of low voltages supplied to the magnetic field sensors.

BACKGROUND OF THE INVENTION

Various types of magnetic field sensing elements are known, including Hall Effect elements and magnetoresistance elements. Magnetic field sensors generally include one or more magnetic field sensing elements along with other electronic components. Some magnetic field sensors also include a fixed permanent magnet.

Magnetic field sensors provide an electrical signal representative of a sensed magnetic field. In some embodiments, the magnetic field sensor provides information about a sensed ferromagnetic object by sensing fluctuations of the magnetic field associated with a magnet part of the magnetic field sensor as an object moves within a magnetic field generated by the magnet. In the presence of a moving ferromagnetic object, the magnetic field signal sensed by the magnetic field sensor varies in accordance with a shape or profile of the moving ferromagnetic object.

In other embodiments, the magnetic field sensor has no magnet, and the magnetic field sensor provides information about position of a sensed object to which a magnet is coupled.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus, it is the rotation of the target object (e.g., camshaft) that is sensed by detection of the moving features of the gear. Gear tooth sensors are used, for example, in automotive applications to provide information to an engine control processor for ignition timing control, fuel management, and other operations.

In other embodiments, a ring magnet with a plurality of alternating poles, which can be ferromagnetic or otherwise magnetic, is coupled to the target object. In these embodiments, the magnetic field sensor senses rotation of the ring magnet and the target object to which it is coupled.

Information provided by the gear tooth sensor to the engine control processor can include, but is not limited to, an absolute angle of rotation of a target object (e.g., a camshaft) as it rotates, a speed of rotation, and, in some embodiments, a direction of rotation. With this information, the engine control processor can adjust the timing of firing of the ignition system and the timing of fuel injection by the fuel injection system.

When used in automotive applications, the power supply for the magnetic field sensor originates with an automobile battery. The battery supplies a nominal voltage of twelve volts, but the battery voltage is subject to very large voltage swings during operation of an automobile. For example, when an automobile engine is undergoing starting, due to a high current draw of an electric starter motor, the battery voltage can experience a large drop in voltage, down to a minimum of about four volts. Shortly thereafter, when the high current draw abruptly stops, voltage on wiring in the automobile, and/or the battery voltage, can experience a very high voltage, i.e., a voltage transient, above fifty volts, for example, 100 volts, due to inductance in the starter motor, in the battery, and in the automobile wiring.

Magnetic field sensors used in automobiles, and in some other applications as well, must both survive the high voltage and also be able to operate at the minimum battery voltage, e.g., four volts.

Magnetic field sensing elements used in magnetic field sensors tend to have sensitivities that are directly related to a voltage with which they are powered or driven. Thus, the minimum battery voltage of about four volts greatly limits the sensitivity of the magnetic field sensing elements within magnetic field sensors.

It would be desirable to provide a magnetic field sensor that can operate with low voltages supplied to the magnetic field sensor, but which can still provide high sensitivity, higher than that which is associated with the low voltages.

SUMMARY OF THE INVENTION

The present invention provides a magnetic field sensor that can operate with low voltages supplied to the magnetic field sensor, but which can still provide high sensitivity, higher than that which is associated with the low voltages.

In accordance with one aspect of the present invention, an electronic circuit includes a power supply input node configured to receive a power supply voltage. The power supply voltage has, at different times, a range of values comprising a steady state power supply voltage value, a maximum power supply voltage value above the steady state value, and a minimum power supply voltage value below the steady state value. The electronic circuit also includes a peak voltage suppression circuit having an input node and an output node. The input node of the peak voltage suppression circuit is coupled to the power supply input node. The peak voltage suppression circuit is configured to suppress the maximum value of the power supply voltage. The peak voltage suppression circuit is configured to generate a suppressed voltage at the output node of the peak voltage suppression circuit. The suppressed voltage has a maximum value below the maximum value of the power supply voltage. The electronic circuit also includes a voltage conversion circuit having an input node and an output node. The input node of the voltage conversion circuit is coupled to the output node of the peak voltage suppression circuit. A converted voltage is generated at the output node of the voltage conversion circuit. When the power supply voltage is at the minimum power supply voltage value, the converted voltage has a minimum converted voltage value higher than the minimum power supply voltage value. The electronic circuit also includes a sensing element coupled to receive a sensing element current or a sensing element voltage derived from the converted voltage, wherein a sensitivity of the sensing element is related to the value of the converted voltage.

BRIEF DESCRIPTION OF THE DRAWINGS

The foregoing features of the invention, as well as the invention itself may be more fully understood from the following detailed description of the drawings, in which:

FIG. 2 is a block diagram showing a magnetic field sensing element, here a Hall element, which can be used as the magnetic field sensing element of FIG. 1, and an associated portion of an electronic circuit that can be used as a portion of the electronic circuit of FIG. 1;

FIG. 3 is a block diagram showing two magnetic field sensing elements, here two Hall elements, which together can be used as the magnetic field sensing element of FIG. 1, and an associated portion of an electronic circuit that can be used as a portion of the electronic circuit of FIG. 1;

FIG. 4 is a block diagram showing a magnetic field sensing element, here a magnetoresistance element, which can be used as the magnetic field sensing element of FIG. 1, and an associated portion of an electronic circuit that can be used as a portion of the electronic circuit of FIG. 1;

FIG. 5 is a block diagram showing two magnetic field sensing elements, here two magnetoresistance elements coupled in a bridge arrangement, which together can be used as the magnetic field sensing element of FIG. 1, and an associated portion of an electronic circuit that can be used as a portion of the electronic circuit of FIG. 1;

FIGS. 12-12C are block diagrams showing capacitors, as may be used in the charge pumps of FIGS. 9-9D and in the boost switching regulator of FIG. 11, as discrete capacitors mounted to a leadframe within an integrated circuit.

DETAILED DESCRIPTION OF THE INVENTION

Figure 1:
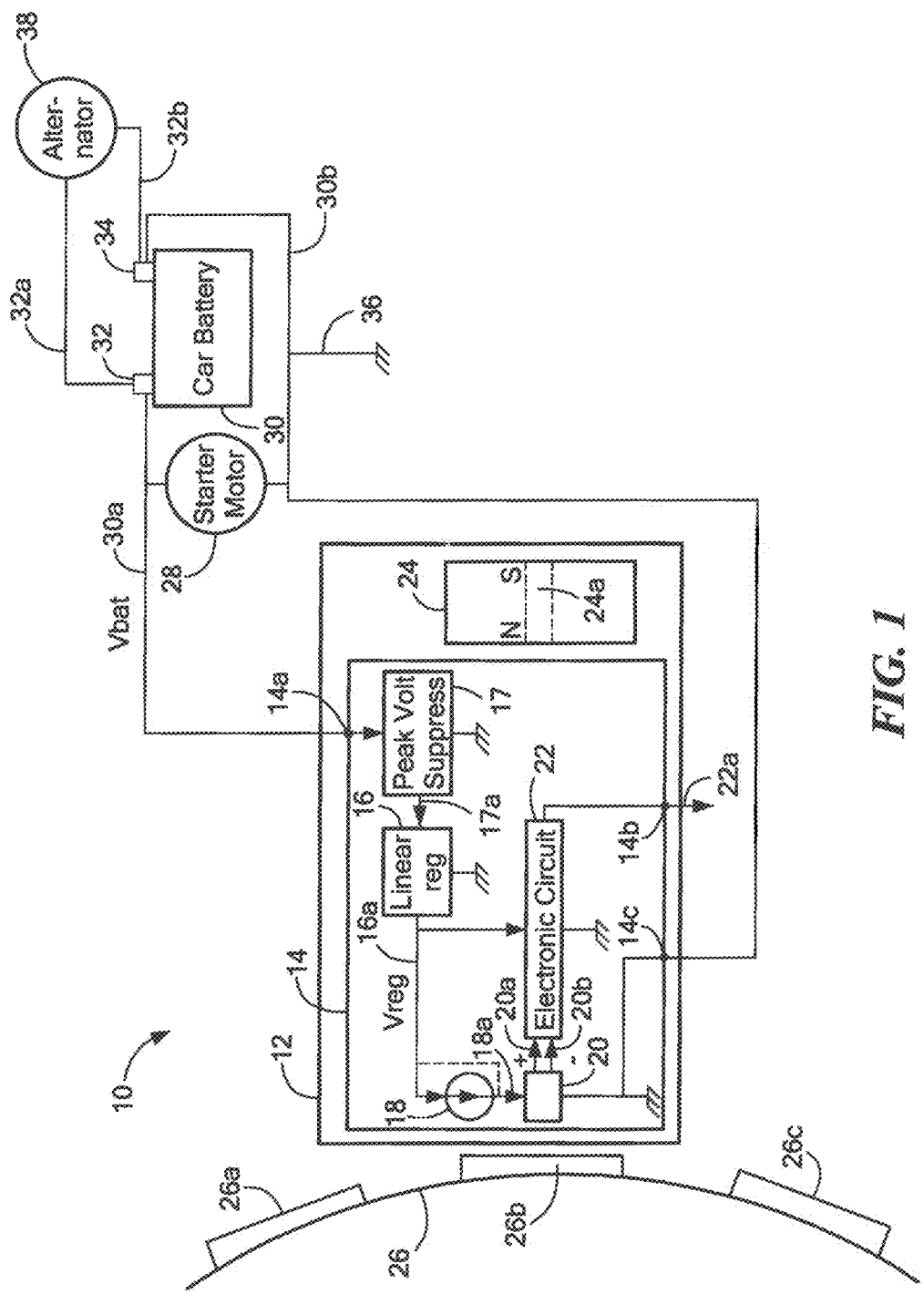
FIG. 1 is a block diagram showing a prior art magnetic field sensor coupled to an automobile power system, wherein the magnetic field sensor includes a magnetic field sensing element and an electronic circuit coupled to the magnetic field sensing element, and wherein the magnetic field sensor has a particular power supply arrangement.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements and semiconductor magnetoresistance elements tend to have axes of sensitivity perpendicular to a substrate, while AMR, GMR, and TMR types of magnetoresistance elements and vertical Hall elements (including circular vertical Hall (CVH) sensing elements) tend to have axes of sensitivity parallel to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector (true power on state (TPOS) detector and precision rotation detector) that senses passing ferromagnetic articles, for example, magnetic domains of a ring magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic (or magnetic) object from the absence of a ferromagnetic object) when the gear is not rotating and/or when the gear is rotating (or, more generally, when a ferromagnetic object (or magnet) is moving or not moving), an ability to identify an edge of a tooth of the gear from the tooth or the valley of the gear (or, more generally, the edge of a ferromagnetic (or magnetic) object), and a rotational accuracy with which the edge of the gear tooth is identified (or, more generally, the positional accuracy with which an edge of a ferromagnetic object (or magnet) can be identified), i.e., output signal edge placement accuracy and consistency with respect to gear tooth edges passing by the magnetic field sensor.

It is desirable for magnetic field sensors to achieve accuracy throughout a range of supply voltages that may be presented to the magnetic field sensors. As described above, it is known that the supply voltages presented to a magnetic field sensor in an automobile application can be very wide range of supply voltages, including both a very high voltage, e.g., one hundred volts, and a very low voltage, e.g., four volts.

Examples below describe a particular gear as may be used upon an engine camshaft target object. However, similar circuits and techniques can be used with other cams or gears disposed upon the engine camshaft, or upon other rotating parts of an engine (e.g., crank shaft, transmission gear, anti-lock braking system (ABS), or upon rotating parts of a device that is not an engine. The gear is not a part of the magnetic field sensor described below. The gear can have ferromagnetic gear teeth.

Also, while examples are shown below of magnetic field sensors that can sense ferromagnetic gear teeth upon a gear configured to rotate, the magnetic field sensors can be used in other applications. The other applications include, but are not limited to, sensing ferromagnetic objects or magnetic objects upon a linear structure configured to move linearly.

Also, magnetic field sensing elements described in examples of magnetic field sensors below can be one or more of any type of magnetic field sensors arranged in any configuration.

Also, while examples below show magnetic field sensors having magnetic field sensing elements, it should be appreciated that the same power supply arrangements described below provide similar advantages for any type of sensing element, including sensing elements that do not sense magnetic fields, in particular, for sensing elements for which sensitivity is related to power supply voltage. Accordingly, while particular voltages are described below that are associated with an automobile power system, in other applications with other types of sensing elements, the voltages can be different voltages.

Referring now to FIG. 1, a conventional magnetic field sensor 12 is disposed at a position to sense passing gear teeth, e.g. 26a, 26b, 26c upon a rotating gear 26. The gear 26 can be disposed upon a target object, for example, upon an end of a camshaft or crankshaft of an engine. Thus, by sensing rotation of the gear 26, the magnetic field sensor can sense rotation of the target object.

The magnetic field sensor 12, when coupled in an automobile application, is coupled to receive a supply voltage 30a from an automobile power system. The automobile power system can include an automobile battery 30 having a positive voltage post 32 and a negative voltage post 34. An alternator 38, driven by an automobile engine (not shown) can generate a current 32a to charge the battery 30. When undergoing charging, the battery 30 has a nominal voltage 30a of about 13.5 volts. When not being charged, the battery 30 has a nominal voltage 30a of about 12.0 volts.

The automobile power system also includes a starter motor, which is a high current draw electric motor configured to spin temporarily and to start the engine (not shown), under control, for example, of an engine ignition switch (not shown) activated by a user. The current instantaneous draw of the starter motor 28 can be one hundred Amperes or more.

In operation, when the starter motor 28 is activated, due to internal resistance of the battery 30 and automobile wiring, the battery voltage 30a can drop to as low as about four volts, whether being charged by the alternator 38 or not. Furthermore, when the starter motor 28 is deactivated, the battery voltage 30a can temporarily achieve very high voltages, for example, one hundred volts, due, in part, to inductances in the starter motor 28, in automobile wiring, and in the battery 30.

The conventional magnetic field sensor 12 includes a substrate 14, which can be a silicon substrate. The substrate 14 can include a power supply node 14a coupled to receive the battery voltage 30a, a ground node 14c coupled to an automobile grounds 36, and an output node 14b at which an output signal 22a is generated. It will be understood that the output signal 22a can be coupled to other circuitry within the automobile, for example, to an engine control processor (not shown).

The substrate 14 can include a peak voltage suppression circuit 17 disposed thereon, coupled to the power supply node 14a, and configured to generate a suppressed voltage 17a. The suppressed voltage 17a has a maximum value below the maximum value of the battery voltage 30a.

The substrate 14 can also include a linear voltage regulator 16 disposed thereon, coupled to receive the suppressed voltage 17a, and configured to generate a regulated voltage 16a, which has a substantially constant voltage value.

The substrate 14 can also include a current source 18 disposed thereon, coupled to receive the regulated voltage 16a, and configured to generate a current 18a. A magnetic field sensing element 20 (or a magnetic field sensing element circuit 20), for example, one or more Hall elements or one or more magnetoresistance elements, can be coupled to receive the current 18a and configured to generate a differential output signal 20a, 20b representative of a magnetic field sensed by the magnetic field sensing element 20. In some alternate embodiments, the current source 18 can be omitted, and the regulated voltage 16a can be coupled directly to the magnetic field sensing element 20.

The substrate 14 can also include an electronic circuit 22 disposed thereon and coupled to receive the differential signal 20a, 20b from the magnetic field sensing element 20. The electronic circuit 22 is configured to generate the output signal 22a.

In a rotation sensor, the electronic circuit 22 can be any one of variety of different types of circuits. Some exemplary electronic circuits used in rotation sensors (also sometimes referred to as proximity detectors) are shown and described in U.S. Pat. No. 7,365,530, issued Apr. 29, 2008, in U.S. Pat. No. 5,917,320, issued Jun. 29, 1999, and in U.S. Pat. No. 7,199,579 issued Apr. 3, 2007, each of which is assigned to the assignee of the present invention, and each of which is incorporated herein by reference in its entirely.

The magnetic field sensor 12 is shown to be a rotation sensor that can generate the output signal 22a indicative of rotation of the gear 26. However, the magnetic field sensor 22 can be a magnetic field sensor used in one of a variety of other types of applications, some of which are described above. Accordingly the electronic circuit 22 can be comprised of any number of different types of electronic circuits.

The magnetic field sensor 12 can also include a magnet 24 having a north pole and a south pole, and, in some embodiments having a central core 24a. The magnet 24 is disposed at a position to provide a magnetic field proximate to the magnetic field sensing element 20. The magnetic field sensing element 20 is responsive to fluctuations in the magnetic field generated by the magnet 24, which fluctuations are generated by passing ones of the gear teeth of the gear 26.

In some embodiments, the output signal 22a generated by the magnetic field sensor 12 is a two state digital signal having edges that occur as edges of gear teeth of the gear 26 pass by the magnetic field sensing element 20.

It will be appreciated that a sensitivity of the magnetic field sensing element 20 is directly related to the regulated voltage 16a and to the current 18a. For reasons described below, it will also be appreciated that, the regulated voltage 16a must be a relatively low voltage, for example, three volts, because the battery voltage can be as low as about four volts.

As described above, the battery voltage 30a, at some times, can be as low as about four volts, and the corresponding suppressed voltage 17a is also as low as about four volts. When this low voltage condition occurs, in order for the linear voltage regulator 16 to achieve linear regulation, the regulated voltage 16a can be no higher than about three volts. Thus, conventional magnetic field sensors used in automobile applications are greatly limited in a sensitivity that can be achieved by magnetic field sensing elements therein.

Referring now to FIG. 2, a magnetic field sensing element circuit 50 can be the same as or similar to the magnetic field sensing element 20 of FIG. 1 in combination with some of the circuitry within the electronic circuit 22 of FIG. 1. The regulated voltage 52 can be the same as or similar to the regulated voltage 16a of FIG. 1.

The magnetic field sensing element circuit 50 includes a current source 54 coupled to receive a regulated voltage 52. A Hall Effect element 58 can be coupled to receive a current 56. The Hall Effect element 58 is configured to generate a differential output signal 58a, 58b, which is coupled to an amplifier 60. The amplifier 60 is configured to generate an output signal 60a.

The current source 54 can be the same as or similar to the current source 18 of FIG. 1. The Hall element 58 can be the same as or similar to the magnetic field sensing element 20 of FIG. 1.

As described above in conjunction with FIG. 1, the Hall Effect element 58 has a sensitivity to magnetic fields (i.e., output voltage per Gauss) directly related to the magnitude of the current 56. In turn, the magnitude of the current 56 is related to a value of the regulated voltage 52. Thus, if only a limited value of the regulated voltage 52 can be achieved, then the sensitivity of the Hall Effect element 58 is limited.

Referring now to FIG. 3, a magnetic field sensing element circuit 70 can be the same as or similar to the magnetic field sensing element 20 of FIG. 1 in combination with some of the circuitry within the electronic circuit 22 of FIG. 1. The magnetic field sensing element circuit 70 includes two current sources 74, 76, each coupled to receive a regulated voltage 72. The regulated voltage 72 can be the same as or similar to the regulated voltage 16a of FIG. 1.

The magnetic field sensing element circuit 70 includes current source 74, 76 coupled to receive a regulated voltage 52. Hall Effect elements 78, 80 can be coupled to receive currents 74a, 76a, respectively. The Hall Effect elements 78, 80 are configured to generate differential output signals 78a, 78b and 80a, 80b, respectively, which are coupled to respective amplifiers 82, 84. The amplifier 82 is configured to generate an output signal 82a, and the amplifier 84 is configured to generate an output signal 84a. An amplifier 86 can be coupled to receive the output signals 82a, 84a and configured to generate an output signal 86a.

The current sources 74, 76 together can be the same as or similar to the current source 18 of FIG. 1. The Hall elements 78, 80 together can be the same as or similar to the magnetic field sensing element 20 of FIG. 1.

Limitations in the sensitivity of the Hall Effect elements 78, 80 related to limitations of the value of the regulated voltage 72 will be understood from the discussion above in conjunction with FIG. 2.

Referring now to FIG. 4, a magnetic field sensing element circuit 100 can be the same as or similar to the magnetic field sensing element 20 of FIG. 1 in combination with some of the circuitry within the electronic circuit 22 of FIG. 1. The magnetic field sensing element circuit 100 includes a voltage divider formed from a coupling of a fixed resistor 104 with a magnetoresistance element 106. The voltage divider is coupled to receive a regulated voltage 102. A junction of the resistor divider is configured to generate a signal 108. An amplifier 110 is coupled to receive the signal 10 wait and configured to generate an output signal 110a.

The magnetoresistance element 106 can be the same as or similar to the magnetic field sensing element 20 of FIG. 1.

Like the circuits of FIGS. 2 and 3 that use Hall Effect elements, the magnetic field sensing element circuit 100, which includes a magnetoresistance element 106, also suffers the same limitations with regard to the value of the regulated voltage 102. The sensitivity of the magnetoresistance element 106 is proportional to the value of the regulated voltage 102.

Referring now to FIG. 5, a magnetic field sensing element circuit 120 can be the same as or similar to the magnetic field sensing element 20 of FIG. 1 in combination with some of the circuitry within the electronic circuit 22 of FIG. 1. The magnetic field sensing element circuit 120 can include two magnetoresistance elements 128, 130 coupled in a bridge arrangement with two fixed resistors 124, 126. The bridge arrangement is coupled to receive a regulated voltage 122. The bridge arrangement is configured to generate a differential output signal 132, 134.

Amplifier 136 is coupled to receive the differential output signal 132, 134 and configured to generate an output signal 136a.

The magnetoresistance elements 128, 130 together can be the same as or similar to the magnetic field sensing element 20 of FIG. 1.

Like the circuits of FIGS. 2 and 3 that use Hall Effect elements, the magnetic field sensing element circuit 120, which includes two magnetoresistance elements 128, 130, also suffers the same limitations with regard to the value of the regulated voltage 122. The sensitivity of the magnetoresistance elements 128, 130 coupled in the bridge arrangement is proportional to the value of the regulated voltage 122.

Figure 6:
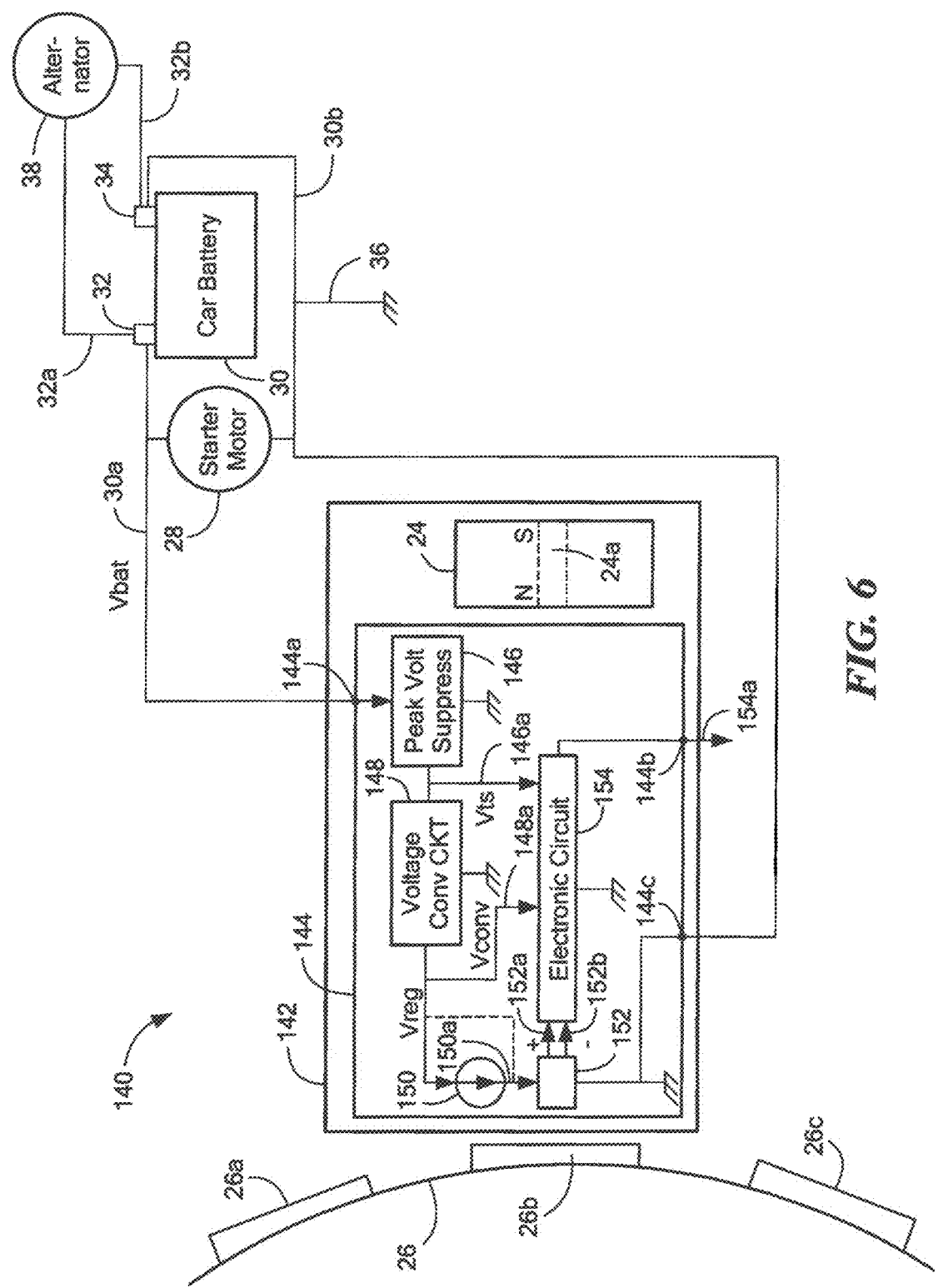
FIG. 6 is a block showing a magnetic field sensor coupled to an automobile power system, wherein the magnetic field sensor includes a magnetic field sensing element and an electronic circuit coupled to the magnetic field sensing element, wherein the magnetic field sensor includes a peak voltage suppression circuit coupled to voltage conversion circuit.

Referring now to FIG. 6, in which like elements of FIG. 1 are shown having like reference designations, a magnetic field sensor 142 includes a substrate 144, which can be a silicon substrate. The substrate 144 can include a power supply node 144a coupled to receive the battery voltage 30a, a ground node 144c coupled to the automobile grounds 36, and an output node 144b at which an output signal 154a is generated. It will be understood that the output signal 154a can be coupled to other circuitry within the automobile, for example, to an engine control processor (not shown).

The substrate 144 can include a peak voltage suppression circuit 146 disposed thereon, coupled to the power supply node 144a, and configured to generate a suppressed voltage 146a. The peak voltage suppression circuit 146 can be the same as or similar to the peak voltage suppression circuit 17 of FIG. 1. The suppressed voltage 146a has a maximum value below the maximum value of the battery voltage 30a.

The substrate 144 can also include a voltage conversion circuit 148 disposed thereon, coupled to receive the suppressed voltage 146a, and configured to generate a converted voltage 148a.

The substrate 144 can also include a current source 150 disposed thereon, coupled to receive the converted voltage 148a, and configured to generate a current 150a. A magnetic field sensing element 152, for example, a Hall element or a magnetoresistance element, can be coupled to receive the current 150a and configured to generate a differential output signal 152a, 152b representative of a magnetic field sensed by the magnetic field sensing element 152. In some alternate embodiments, the current source 150 can be omitted, and the converted voltage 148a can be coupled directly to the magnetic field sensing element 152.

The substrate 144 can also include an electronic circuit 154 disposed thereon and coupled to receive the differential signal 152a, 152b from the magnetic field sensing element 152. The electronic circuit 154 is configured to generate the output signal 154a. The electronic circuit 154 can be the same as or similar to the electronic circuit 22 of FIG. 1. The magnetic field sensing element 152 can be the same as or similar to the magnetic field sensing element 20 of FIG. 1.

The converted voltage 148a can have a voltage higher than a value of the regulated voltage 16a of FIG. 1, even in the presence of the minimum value of the battery voltage 30a, which can be as low as about four volts. Thus, the magnetic field sensing element 152 can have a higher sensitivity than the magnetic field sensing element 20 of FIG. 1.

Further details of exemplary voltage conversion circuits 148 are described below in conjunction with FIGS. 7 and 8. Let it suffice here to say that the converted voltage 148a has a voltage higher than the voltage of the regulated voltage 16a of FIG. 1. Accordingly, when the power supply voltage 30a is at the minimum power supply voltage value, e.g., four volts, the converted voltage 148a has a minimum converted voltage value higher than the minimum power supply voltage, e.g., higher than four volts. The higher voltage allows the magnetic field sensing element 152 to have a higher sensitivity than that which can be achieved with the magnetic field sensor 12 of FIG. 1.

In some embodiments, the converted voltage 148a has a substantially constant voltage value throughout the range of power supply voltages 30a. In some embodiments, the converted voltage 148a is greater than about four volts. In some other embodiments, the converted voltage 148a is about six volts. In some other embodiments, the converted voltage 148a is about nine volts. In some other embodiments, the converted voltage 148a is about twelve volts. In some other embodiments, the converted voltage 148a is about seven volts. In some other embodiments, the converted voltage 148a is about fifteen volts. In some other embodiments, the converted voltage 148a is about twelve volts. However, the converted voltage 148a can have any voltage value greater than the minimum voltage of the power supply voltage 30a.

Figure 7:
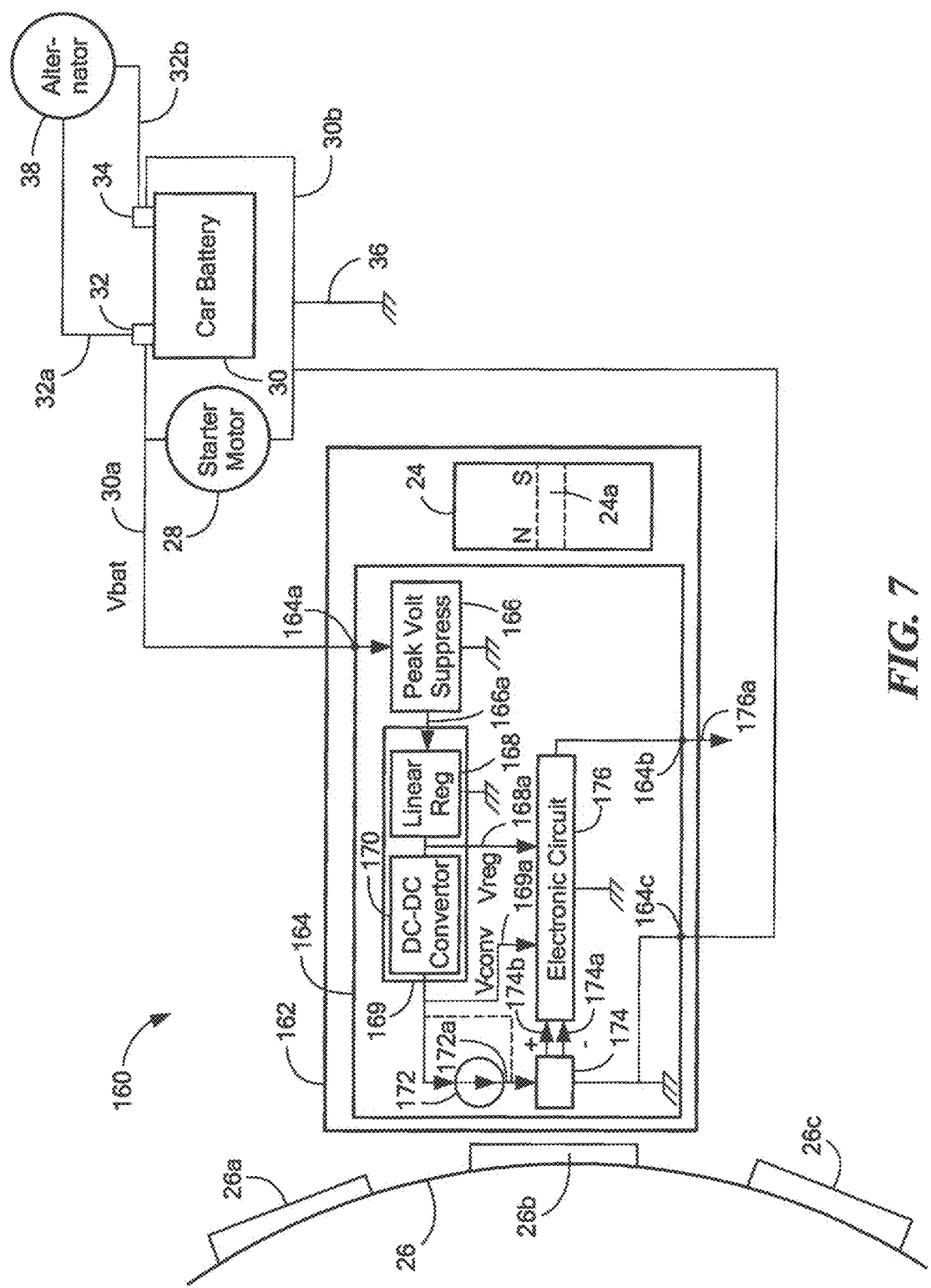
FIG. 7 is a block showing a magnetic field sensor coupled to an automobile power system, wherein the magnetic field sensor includes a magnetic field sensing element and an electronic circuit coupled to the magnetic field sensing element, wherein the magnetic field sensor also includes a peak voltage suppression circuit coupled to a voltage conversion circuit, wherein the voltage conversion circuit includes a linear regulator preceding a DC-DC converter.

Referring now to FIG. 7, in which like elements of FIG. 1 are shown having like reference designations, a magnetic field sensor 162 includes a substrate 164, which can be a silicon substrate. The substrate 164 can include a power supply node 164a coupled to receive the battery voltage 30a, a ground node 164c coupled to the automobile grounds 36, and an output node 164b at which an output signal 176a is generated. It will be understood that the output signal 176a can be coupled to other circuitry within the automobile, for example, to an engine control processor (not shown).

The substrate 164 can include a peak voltage suppression circuit 166 disposed thereon and coupled to the power supply node 164a and configured to generate a suppressed voltage 166a. The peak voltage suppression circuit 166 can be the same as or similar to the peak voltage suppression circuit 17 of FIG. 1. The suppressed voltage 166a has a maximum value below the maximum value of the battery voltage 30a.

The substrate 164 can also include a voltage conversion circuit 169 disposed thereon, coupled to receive the suppressed voltage 166a, and configured to generate a converted voltage 169a. The voltage conversion circuit 169 can be the same as or similar to the voltage conversion circuit 148 of FIG. 6.

The substrate 164 can also include a current source 172 disposed thereon, coupled to receive the converted voltage 169a, and configured to generate a current 172a. A magnetic field sensing element 174, for example, a Hall element or a magnetoresistance element, can be coupled to receive the current 172a and configured to generate a differential output signal 174a, 174b representative of a magnetic field sensed by the magnetic field sensing element 174. In some alternate embodiments, the current source 172 can be omitted, and the converted voltage 169a can be coupled directly to the magnetic field sensing element 174.

The substrate 164 can also include an electronic circuit 176 disposed thereon and coupled to receive the differential signal 174a, 174b from the magnetic field sensing element 172. The electronic circuit 176 is configured to generate the output signal 176a. The electronic circuit 176 can be the same as or similar to the electronic circuit 22 of FIG. 1. The magnetic field sensing element 174 can be the same as or similar to the magnetic field sensing element 20 of FIG. 1.

The converted voltage 169a can have a voltage higher than a value of the regulated voltage 16a of FIG. 1, even in the presence of the minimum value of the battery voltage 30a, which can be as low as about four volts. Thus, the magnetic field sensing element 174 can have a higher sensitivity than the magnetic field sensing element 20 of FIG. 1.

In some embodiments, the voltage conversion circuit 169 can include a linear voltage regulator 168 coupled to receive the suppressed voltage 166a and configured to generate a regulated voltage 168a. The voltage conversion circuit 169 can also include a DC-DC converter 170 coupled to receive the regulated voltage 168a and configured to generate the converted voltage 169a.

The DC-DC converter 170 can be any DC-DC converter that can generate a higher voltage than it receives at the input. For example, in some embodiments, the DC-DC converter 170 can be a charge pump. For another example, in some embodiments, the DC-DC converter 170 can be a boost switching regulator. The DC-DC converter 170 includes some form of switching circuit that allows the DC-DC converter 170 to step up a received voltage.

It will be recognized that the regulated voltage 168a can have voltage values the same as or similar to the regulated voltage 16a of FIG. 1. However, the DC-DC converter 170 operates to generate the converted voltage 169a with a value higher than the regulated voltage 168a. For example, for embodiments in which the lowest power supply voltage 30a is about four volts, and the regulated voltage 168a has a constant value of about three volts, the converted voltage 169a can be about six, about nine, or about twelve volts. In some embodiments, the converted voltage 169a has a substantially constant voltage value throughout the range of power supply voltages 30a.

The converted voltage 169a has a voltage higher than the voltage of the regulated voltage 16a of FIG. 1. Accordingly, when the power supply voltage 30a is at the minimum power supply voltage value, e.g., four volts, the converted voltage 169a has a minimum converted voltage value higher than the minimum power supply voltage, e.g., higher than four volts. The higher voltage allows the magnetic field sensing element 174 to have a higher sensitivity than that which can be achieved with the magnetic field sensor 12 of FIG. 1.

Figure 8:
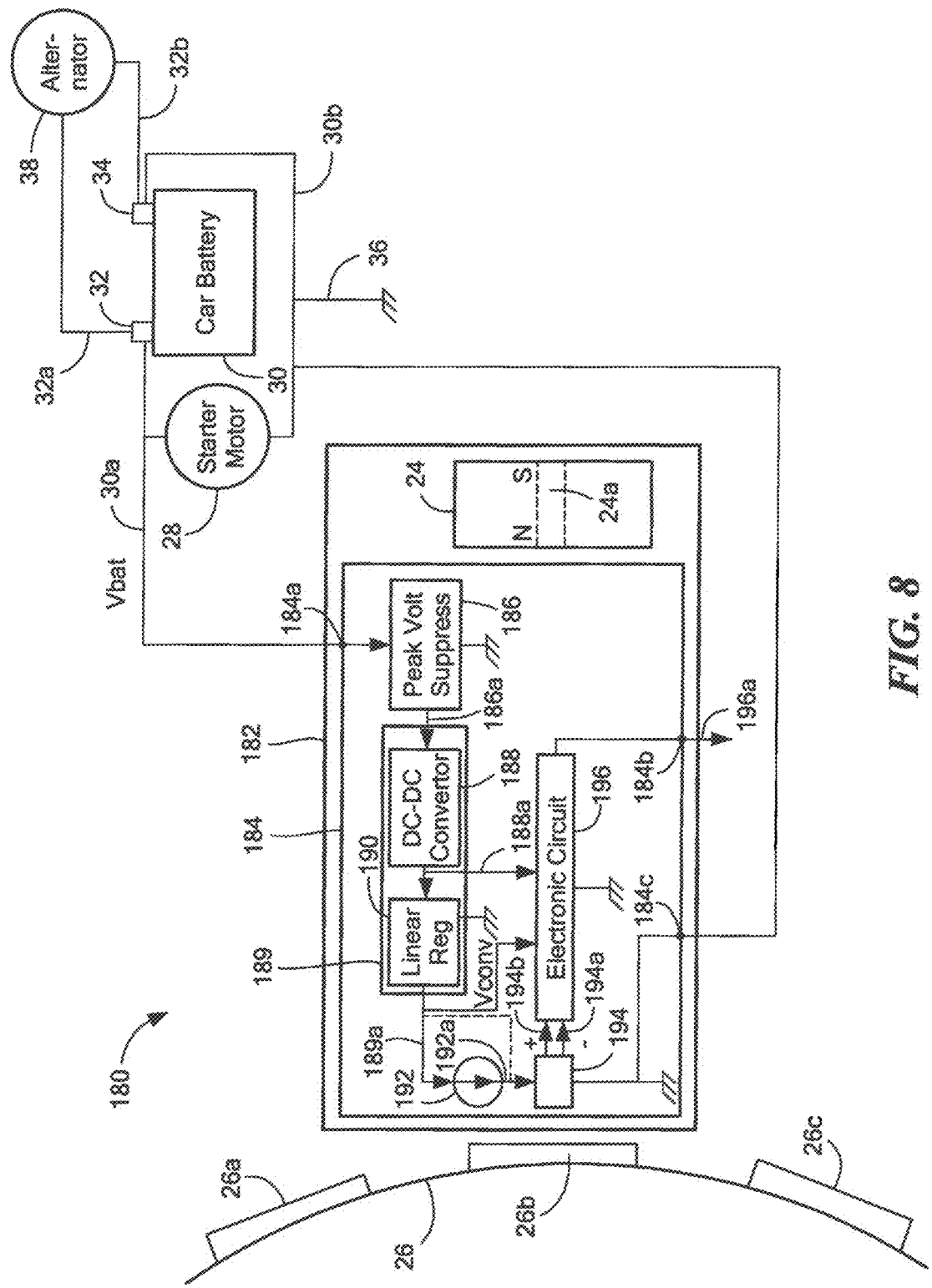
FIG. 8 is a block showing a magnetic field sensor coupled to an automobile power system, wherein the magnetic field sensor includes a magnetic field sensing element and an electronic circuit coupled to the magnetic field sensing element, wherein the magnetic field sensor also includes a peak voltage suppression circuit coupled to a voltage conversion circuit, wherein the voltage conversion circuit includes a DC-DC converter preceding a linear regulator.

Referring now to FIG. 8, in which like elements of FIG. 1 are shown having like reference designations, a magnetic field sensor 182 includes a substrate 184, which can be a silicon substrate. The substrate 184 can include a power supply node 184a coupled to receive the battery voltage 30a, a ground node 184c coupled to the automobile grounds 36, and an output node 184b at which an output signal 196a is generated. It will be understood that the output signal 196a can be coupled to other circuitry within the automobile, for example, to an engine control processor (not shown).

The substrate 184 can include a peak voltage suppression circuit 186 disposed thereon and coupled to the power supply node 184a and configured to generate a suppressed voltage 186a. The peak voltage suppression circuit 186 can be the same as or similar to the peak voltage suppression circuit 17 of FIG. 1. The suppressed voltage 186a has a maximum value below the maximum value of the battery voltage 30a.

The substrate 184 can also include a voltage conversion circuit 189 disposed thereon, coupled to receive the suppressed voltage 186a, and configured to generate a converted voltage 189a. The voltage conversion circuit 189 can be the same as or similar to the voltage conversion circuit 148 of FIG. 6.

The substrate 184 can also include a current source 192 disposed thereon, coupled to receive the converted voltage 189a, and configured to generate a current 192a. A magnetic field sensing element 194, for example, a Hall element or a magnetoresistance element, can be coupled to receive the current 192a and configured to generate a differential output signal 194a, 194b representative of a magnetic field sensed by the magnetic field sensing element 194. In some alternate embodiments, the current source 192 can be omitted, and the converted voltage 189a can be coupled directly to the magnetic field sensing element 194.

The substrate 184 can also include an electronic circuit 196 disposed thereon and coupled to receive the differential signal 194a, 194b from the magnetic field sensing element 192. The electronic circuit 196 is configured to generate the output signal 196a. The electronic circuit 196 can be the same as or similar to the electronic circuit 22 of FIG. 1. The magnetic field sensing element 194 can be the same as or similar to the magnetic field sensing element 20 of FIG. 1.

The converted voltage 189a can have a voltage higher than a value of the regulated voltage 16a of FIG. 1, even in the presence of the minimum value of the battery voltage 30a, which can be as low as about four volts. Thus, the magnetic field sensing element 194 can have a higher sensitivity than the magnetic field sensing element 20 of FIG. 1.

In some embodiments, the voltage conversion circuit 189 can include a DC-DC converter 188 coupled to receive the suppressed voltage 186a and configured to generate a voltage 188a. The voltage conversion circuit 189 can also include a linear voltage regulator 190 coupled to receive the voltage 188a and configured to generated the converted voltage 189a.

The DC-DC converter 188 can be any DC-DC converter that can generate a higher voltage than it receives at the input. For example, in some embodiments, the DC-DC converter 188 can be a charge pump. For another example, in some embodiments, the DC-DC converter 188 can be a boost switching regulator. The DC-DC converter 188 includes some form of switching circuit that allows the DC-DC converter 188 to step up a received voltage.

The DC-DC converter 170 operates to generate the voltage 188a with a value higher than the power supply voltage 30a. For example, for embodiments in which the lowest power supply voltage 30a is about four volts, the voltage 168a can have a lowest voltage value of about eight, about twelve, or about sixteen volts. Accordingly, the converted voltage can be about seven, about eleven, or about fifteen volts. In some embodiments, due to operation of the linear regulator 190, the converted voltage 169a has a substantially constant voltage value throughout the range of power supply voltages 30a.

The converted voltage 189a has a voltage higher than the voltage of the regulated voltage 16a of FIG. 1. Accordingly, when the power supply voltage 30a is at the minimum power supply voltage value, e.g., four volts, the converted voltage 169a has a minimum converted voltage value higher than the minimum power supply voltage, e.g., higher than four volts. The higher voltage allows the magnetic field sensing element 194 to have a higher sensitivity than that which can be achieved with the magnetic field sensor 12 of FIG. 1.

Figure 9:
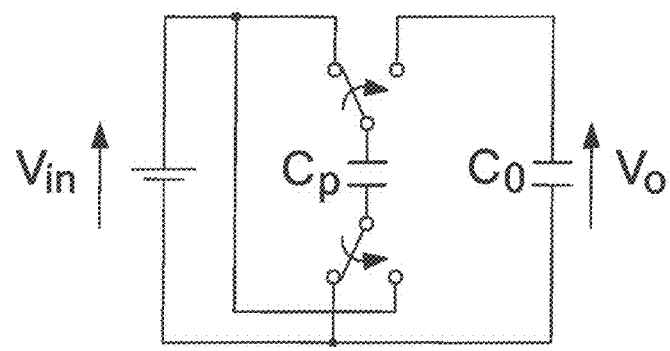
FIGS. 9-9D are block diagrams showing a variety of forms of charge pumps that can be used as the DC-DC converters of FIGS. 7 and 8.
Figure 9A:
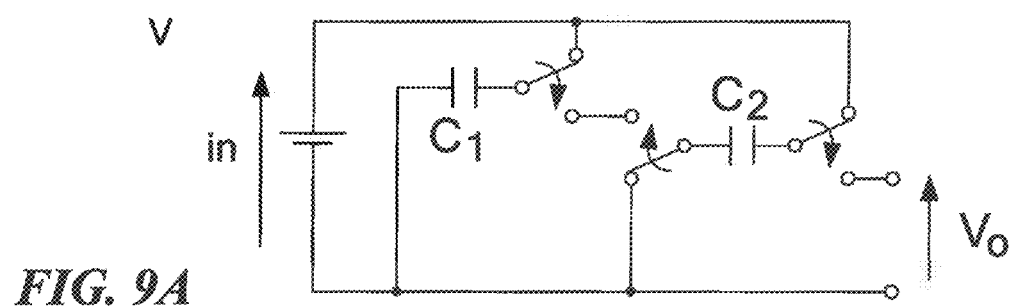
Figure 9B:
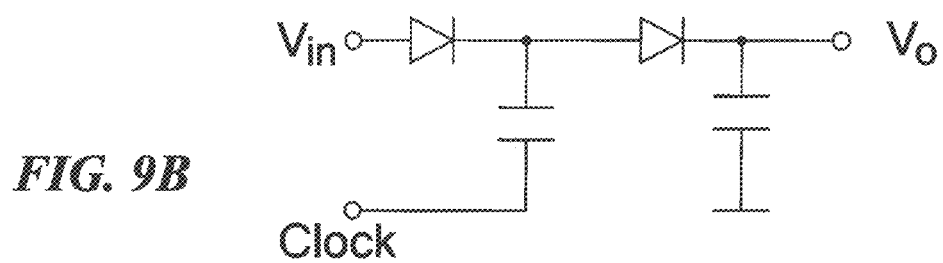
Figure 9C:
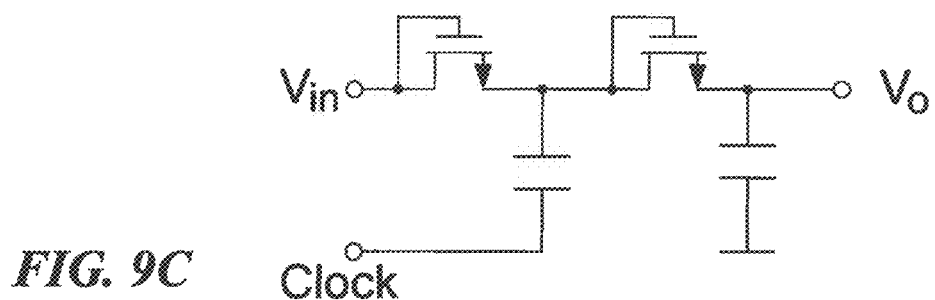

Referring now to FIGS. 9-9C, four different configurations of charge pumps are shown, each capable of generating at its respective output a voltage higher than a voltage provided at its respective input. The charge pumps of FIGS. 9-9C can provide the DC-DC converters 170, 188 of FIGS. 7 and 8. Each of these charge pumps is a doubling charge pump configured to generate a voltage approximately double the voltage provided at the input. Each one of the charge pumps comprises two capacitors.

It will be understood how to configure other charge pumps that can triple or quadruple an input voltage.

A size of the capacitors is selected based upon a variety of factors. The factors include, but are not limited to, a frequency are which switches are toggled or a frequency used as a clock signal, an average current draw extracted from the charge pumps, and an amount of ripple that is desired in the output voltage.

Figure 9D:
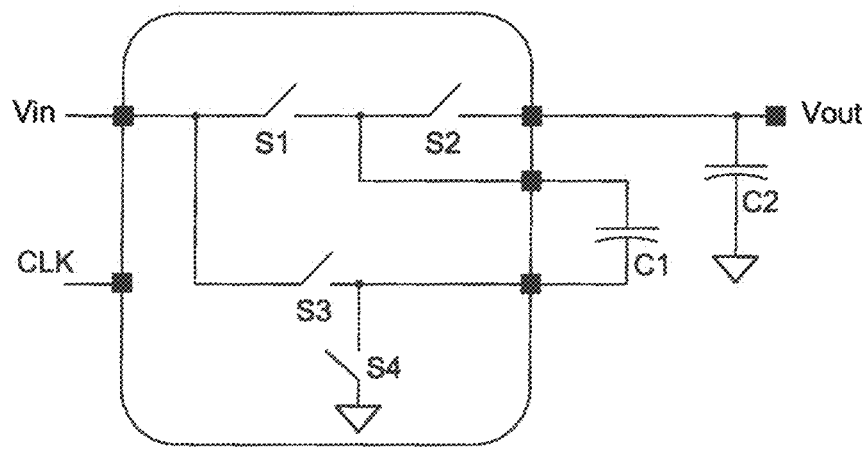

Referring now to FIG. 9D, another exemplary charge pump acts as a doubling charge pump. The charge pump of FIG. 9D can provide the DC-DC converters 170, 188 of FIGS. 7 and 8.

The charge pump includes four switches, S1-S4 disposed upon a substrate and two capacitors disposed apart from the substrate (but which, in some embodiments, can be upon the substrate). A clock signal, CLK, is operable to close some of the switches at any particular time, and to close other ones of the switches at other times.

In a first phase of operation (i.e., during a first state of the clock signal), the switches S1, S4 are closed and the switches S2, S3 are open. In a second phase of operation (i.e., during a second different state of the clock signal), the switches S2, S3 are closed and the switches S1, S4 are open.

In some embodiments of the charge pumps of FIGS. 9-9D, the clock signal has a frequency of about 40 MHz, the current draw of any one of the current sensors 142, 162, 182 of FIGS. 6, 7, 8, respectively, is about 1 mA, and the allowable ripple from the charge pumps is about 50 mV. These factors result in charge pump capacitors with values of about 100 pF and 100 nF.

Figure 11:
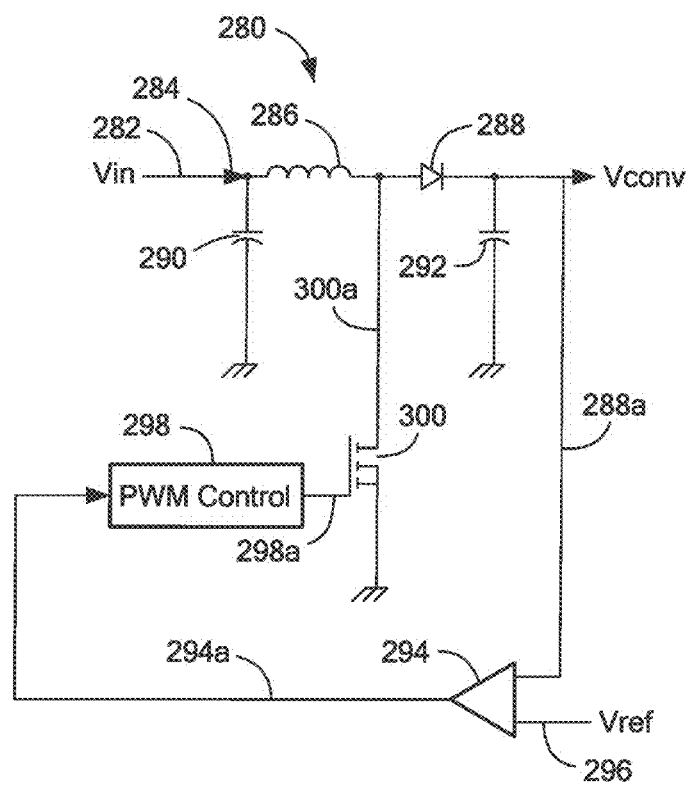
FIG. 11 is a block diagram of a boost switching regulator that can be used as the DC-DC converter of FIGS. 7 and 8.

It is possible to fabricate capacitors directly upon a substrate using integrated circuit fabrication techniques, e.g., metal layers separated by a dielectric material. Some techniques are described in U.S. Pat. No. 7,573,112, issued Aug. 11, 2009, assigned to the assignee of the present application, and incorporated by reference herein in its entirety. In some embodiments, the capacitors of the charge pumps of FIGS. 9-9D and of the boost switching regulator of FIG. 11 are fabricated by such techniques.

However, other techniques described below in conjunction with FIGS. 12-12C can provide capacitors separate from an integrated circuit substrate but still within a packaged integrated circuit.

Figure 10:
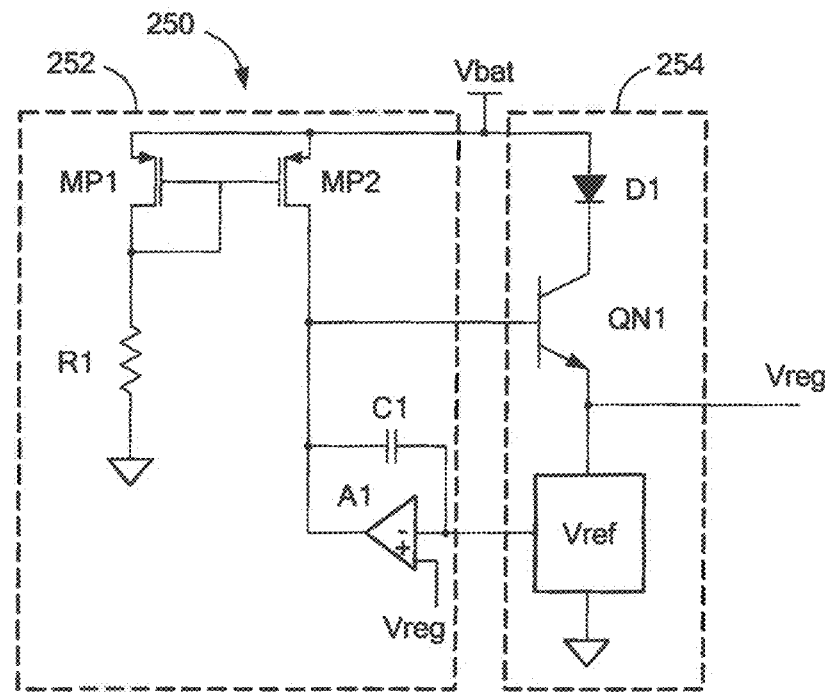
FIG. 10 is a block diagram of a peak voltage suppression circuit and a linear regulator that can be used as the peak voltage suppression circuit of FIGS. 6, 7, 8 and the linear voltage regulator of FIGS. 7 and 8.

Referring now to FIG. 10, an electronic circuit 250 can include a peak voltage suppression circuit portion 252 and a linear voltage regulator portion 254 that can be used as shown as the peak voltage suppression circuit 166 and the linear voltage regulator 168 of FIG. 7. However, it will be understood that the peak voltage suppression circuit portion 252 can be separated from the linear voltage regulator portion 254 to provide the arrangement of FIG. 8.

The peak voltage suppression circuit 252 can include a current mirror formed from two field effect transistors (FETs) MP1, MP2 coupled to receive a power supply voltage Vbat, i.e., the power supply voltage 30a of FIG. 7. An output of the current mirror can be coupled to a base of a transistor QN1 within the voltage regulator portion 252.

A feedback circuit can be comprised of an integrator having an amplifier A1 with a feedback capacitor C1. An output of the amplifier A1 can also be coupled to the base of the transistor QN1.

The voltage regulator portion 252 can include a diode D1 having a cathode coupled to the power supply voltage Vbat. An anode of the diode D1 can be coupled to a collector of the transistor QN1. An emitter of the transistor QN1 can be coupled to a reference voltage device Vref, which can be, for example, a PTAT (proportional to ambient temp) reference.

A regulated output voltage Vreg is generated at the emitter of the transistor QN1.

In operation, if the power supply voltage Vbat experiences a high voltage for reasons described above, feedback by way to the amplifier A1 regulates the transistor, QN1, protecting the reference voltage device, Vref, and also protecting any circuit or system coupled to the Vreg line. in preferred embodiments, the breakdown voltage, BV, of the circuit elements within the electronic circuit 250 is such that the high voltage does not cause destruction. For example, in some embodiments, the BV can be approximately forty volts. In some embodiments, a bandwidth of the feedback loop is selected to ensure that voltage spikes in the voltage, Vbat, do not substantially propagate to the voltage, Vreg. Even if negative voltage pulses or negative DC conditions occur in the voltage, Vbat, the diode, D1, will ensure survivability of the electronic circuit 250.

Referring now to FIG. 11, in some embodiments, a boost switching regulator 280 can form the DC-DC converters 170, 188 of FIGS. 7 and 8, respectively. The boost switching regulator 280 can include a diode 284 coupled to receive an input voltage 282 at a cathode end. An anode end of the diode 284 can be coupled to an inductor 286. The other end of the inductor 286 can be coupled to a cathode end of a diode 288. A capacitor 290 can be coupled between the anode end of the diode 284 and ground. A diode 292 can be coupled between the anode end of the diode 288 and ground.

A feedback amplifier 294 can have an input node coupled to the anode of the diode 288. At another input node of the amplifier 294 can be coupled to receive a reference voltage 296. An output signal 294a can be provided as an input to a pulse width modulation (PWM) control circuit 298. The pulse width modulation control circuit 298 is configured to generate a pulse width modulation signal 298a with a duty cycle responsive to the feedback signal 294a.

The boost switching regulator 280 can also include a switching device 300, here shown as a field effect transistor (FET). The FET can be coupled to receive the PWM signal 298a at a gate node. A drain node of the FET 300 can be coupled between the cathode end of the diode 288 and ground.

In operation, by way of the feedback provided by the amplifier 294, a PWM rate of the switching device 300 is controlled to provide a regulated output voltage 288a as an output from the switching regulator 280.

Sizes of the capacitors 290, 292 are selected in accordance with a variety of factors. The factors can include, but are not limited to, a switching frequency of switching of the switching device 300, a current draw from the switching regulator 280, and an amount of ripple desired in the output voltage 288a.

In some embodiments, the capacitors 290, 292, and also the inductor 286 are formed upon a substrate and formed by integrated circuit fabrication techniques. However, buy techniques described more fully below, the capacitors 290, 292 and/or the inductor 286 can be apart from a substrate but still within the packaged integrated circuit.

It is known that a boost switching regulator can provide an output voltage higher than an input voltage by any predetermined amount. The predetermined amount is set by way of the reference voltage 296 supplied to the amplifier 294.

Referring now to FIGS. 12 and 12A, an integrated circuit (IC) package 400 has first and second capacitors 402a, 402b. Illustrative dimensions are shown in accordance with an exemplary embodiment of the invention. A die 404 is connected to a leadframe 406 having a cutout region 408 in which the capacitors 402a, 402b can be positioned below a surface 410 of the leadframe 406, but coupled to portions of the leadframe 406. Thus, the capacitors 402a, 402b can be coupled to circuits upon the die 404. A plastic or other material can be used as molding 412 to encapsulate the assembly.

The die 404 comprises a substrate, which can be the same as or similar to the substrates 144, 164, 184 of FIGS. 6, 7 and 8, respectively.

Referring now to FIGS. 12B and 12C, in the illustrated embodiment, prior to and during installation, the capacitors 402 can be mounted on tape 414, such as polyimide tape (KAPTON is one trade name for polyimide tape) with conductive foil. A tape automated bonding process (TAB) with a continuous reel can be used for the capacitors 402. With this arrangement, the assembly will remain intact during a subsequent molding process.

The IC package 400 having the capacitors 402a, 402b can be a Hall Effect magnetic field sensor. In some embodiments, a magnet (not shown) can be within IC package 400. As described above, the magnetic field sensor 400 is useful to detect movement of an object of interest by monitoring changes in a magnetic field.

The exemplary sensor package 400 (shown without a magnet) has dimensions of about 0.24 inch long, about 0.184 inches wide, and about 0.76 inch deep, i.e., thickness. The leadframe 406 is about 0.01 inches in thickness with the cutout region about 0.04 inches to enable placement of the capacitors 402 below the leadframe surface.

The capacitance of the capacitors can vary. In general, the capacitance can range from about 500 pF to about 200 nF.

It will be appreciated that the capacitors 402a, 402b can provide the capacitors of any one of the charge pumps of FIGS. 9-9D and also the two capacitors of the boost switching regulator 250 of FIG. 11.

It will also be appreciated that an inductor can similarly be coupled to a leadframe of an integrated circuit, as is used in the boost switching regulator 250 of FIG. 11.

The arrangements of FIGS. 12-12C are further described, for example, in U.S. patent application Ser. No. 11/457,626, entitled "Methods And Apparatus For Passive Attachment Of Components For Integrated Circuits," filed Jul. 14, 2006.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An electronic circuit, comprising:
a power supply input node configured to receive a power supply voltage, wherein the power supply voltage has, at different times, a range of values comprising a steady state power supply voltage value, a maximum power supply voltage value above the steady state value, and a minimum power supply voltage value below the steady state value;
a peak voltage suppression circuit having an input node and an output node, wherein the input node of the peak voltage suppression circuit is coupled to the power supply input node, wherein the peak voltage suppression circuit is configured to suppress the maximum value of the power supply voltage, wherein the peak voltage suppression circuit is configured to generate a suppressed voltage at the output node of the peak voltage suppression circuit, wherein the suppressed voltage has a maximum value below the maximum value of the power supply voltage;
a voltage conversion circuit having an input node and an output node, wherein the input node of the voltage conversion circuit is coupled to the output node of the peak voltage suppression circuit, wherein a converted voltage is generated at the output node of the voltage conversion circuit, wherein, when the power supply voltage is at the minimum power supply voltage value, the converted voltage has a minimum converted voltage value higher than the minimum power supply voltage value;
a sensing element coupled to receive a sensing element current or a sensing element voltage derived from the converted voltage, wherein a sensitivity of the sensing element is related to the value of the converted voltage.

2. The electronic circuit of claim 1, wherein the sensing element comprises a magnetic field sensing element.

3. The electronic circuit of claim 2, wherein the converted voltage has a substantially constant value throughout the range of power supply voltages, wherein the voltage conversion circuit comprises:
a linear voltage regulator having an input node and an output node, wherein the linear voltage regulator is configured to generate a linearly regulated voltage at the output node of the linear regulator, wherein the input node of the linear voltage regulator is coupled to the output node of the peak voltage suppression circuit; and
a DC-DC converter having an input node and an output node, wherein the input node of the DC-DC converter is coupled to the output node of the linear voltage regulator, wherein the output node of the DC-DC converter is coupled to the output node of the voltage conversion circuit, and wherein the DC-DC converter comprises a switching circuit.

4. The electronic circuit of claim 3, wherein the peak voltage suppression circuit and the linear voltage regulator are conjoined in a common peak voltage suppressed linear voltage regulator arrangement.

5. The electronic circuit of claim 3, wherein the steady state value of the power supply voltage is between about 12 volts and about 14 volts, wherein the maximum value of the power supply voltage is above fifty volts, and wherein the minimum value of the power supply voltage is about four volts.

6. The electronic circuit of claim 5, wherein the linearly-regulated voltage is about three volts.

7. The electronic circuit of claim 6, wherein the DC-DC converter comprises a charge pump.

8. The electronic circuit of claim 7, further comprising:
a semiconductor substrate, wherein the linear regulator comprises a plurality of active electronic components formed upon the semiconductor substrate, wherein the charge pump comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the charge pump comprises a discrete capacitor, wherein the discrete capacitors is electrically coupled to the semiconductor substrate and encapsulated by the mold compound.

9. The electronic circuit of claim 8, wherein the discrete capacitor is directly coupled to the lead frame apart from the semiconductor substrate.

10. The electronic circuit of claim 8, wherein the discrete capacitor comprises a plurality of layers upon the substrate.

11. The electronic circuit of claim 6, wherein the DC-DC converter comprises a switching regulator.

12. The electronic circuit of claim 11, further comprising:
a semiconductor substrate, wherein the linear regulator comprises a plurality of active electronic components formed upon the semiconductor substrate, wherein the switching regulator comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the switching regulator comprises a discrete electronic component, wherein discrete electronic component is electrically coupled to the semiconductor substrate and encapsulated by the mold compound.

13. The electronic circuit of claim 12, wherein the discrete electronic component is directly coupled to the lead frame apart from the semiconductor substrate.

14. The electronic circuit of claim 12, wherein the discrete electronic component comprises a discrete capacitor comprising a plurality of layers upon the substrate.

15. The electronic circuit of claim 3, wherein the DC-DC converter comprises a charge pump.

16. The electronic circuit of claim 15, further comprising:
a semiconductor substrate, wherein the linear regulator comprises a plurality of active electronic components formed upon the semiconductor substrate, wherein the charge pump comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the charge pump comprises a discrete capacitor, wherein the discrete capacitor is electrically coupled to the semiconductor substrate and encapsulated by the mold compound.

17. The electronic circuit of claim 16, wherein the discrete capacitor is directly coupled to the lead frame apart from the semiconductor substrate.

18. The electronic circuit of claim 16, wherein the discrete capacitor comprises a plurality of layers upon the substrate.

19. The electronic circuit of claim 3, wherein the DC-DC converter comprises a switching regulator.

20. The electronic circuit of claim 19, further comprising:
a semiconductor substrate, wherein the linear regulator comprises a plurality of active electronic components formed upon the semiconductor substrate, wherein the switching regulator comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the switching regulator comprises a discrete electronic component, wherein discrete electronic component is electrically coupled to the semiconductor substrate and encapsulated by the mold compound.

21. The electronic circuit of claim 20, wherein the discrete electronic component is directly coupled to the lead frame apart from the s semiconductor substrate.

22. The electronic circuit of claim 20, wherein the discrete electronic component comprises a discrete capacitor comprising a plurality of layers upon the substrate.

23. The electronic circuit of claim 2, wherein the converted voltage has a substantially constant value throughout the range of power supply voltages, wherein the voltage conversion circuit comprises:
a DC-DC converter having an input node and an output node, wherein the input node of the DC-DC converter is coupled to the output node of the peak voltage suppression circuit, and wherein the DC-DC converter comprises a switching circuit; and
a linear voltage regulator having an input node and an output node, wherein the input node of the linear voltage regulator is coupled to the output node of the DC-DC converter, wherein the linear voltage regulator is configured to generate a linearly regulated voltage at the output node of the linear voltage regulator, and wherein the output node of the linear voltage regulator is coupled to the output node of the voltage conversion circuit.

24. The electronic circuit of claim 23, wherein the steady state value of the power supply voltage is between about 12 volts and about 14 volts, wherein the maximum value of the power supply voltage is above fifty volts, and wherein the minimum value of the power supply voltage is about four volts.

25. The electronic circuit of claim 24, wherein the linearly regulated voltage is above four volts.

26. The electronic circuit of claim 25, wherein the DC-DC converter comprises a charge pump.

27. The electronic circuit of claim 26, further comprising:
a semiconductor substrate, wherein the linear regulator comprises a plurality of active electronic components formed upon the semiconductor substrate, wherein the charge pump comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the charge pump comprises a discrete capacitor, wherein the discrete capacitors is electrically coupled to the semiconductor substrate and encapsulated by the mold compound.

28. The electronic circuit of claim 27, wherein the discrete capacitor is directly coupled to the lead frame apart from the semiconductor substrate.

29. The electronic circuit of claim 27, wherein the discrete capacitor comprises plurality of layers upon the substrate.

30. The electronic circuit of claim 25, wherein the DC-DC converter comprises a switching regulator.

31. The electronic circuit of claim 30, further comprising:
a semiconductor substrate, wherein the linear regulator comprises a plurality of active electronic components formed upon the semiconductor substrate, wherein the switching regulator comprises a plurality of active electronic components formed upon the semiconductor substrate, and wherein the sensing element is formed upon the semiconductor substrate;
a lead frame coupled to the semiconductor substrate, wherein the lead frame comprises a plurality of leads; and
a mold compound encapsulating the semiconductor substrate and covering a portion of the lead frame, wherein the switching regulator comprises a discrete electronic component, wherein discrete electronic component is electrically coupled to the semiconductor substrate and encapsulated by the mold compound.

32. The electronic circuit of claim 31, wherein the discrete electronic component is directly coupled to the lead frame apart from the semiconductor substrate.

33. The electronic circuit of claim 31, wherein the discrete electronic component comprises a discrete capacitor comprising a plurality of layers upon the substrate.

34. The electronic circuit of claim 23, wherein the DC-DC converter comprises a charge pump.

35. The electronic circuit of claim 34, further comprising:
a semiconductor substrate, wherein the linear regulator comprises a plurality of active electronic components formed upon the semiconductor substrate, wherein the charge pump comprises a plurality of active electronic components formed upon the semiconductor substrate, and wherein the sensing element is formed upon the semiconductor substrate;

a lead frame coupled to the semiconductor substrate, wherein the lead frame comprises a plurality of leads; and a mold compound encapsulating the semiconductor substrate and covering a portion of the lead frame, wherein the charge pump comprises a discrete capacitor, wherein the discrete capacitor is electrically coupled to the semiconductor substrate and encapsulated by the mold compound.

36. The electronic circuit of claim 35, wherein the discrete capacitor is directly coupled to the lead frame apart from the semiconductor substrate.

37. The electronic circuit of claim 35, wherein the discrete capacitor comprises a plurality of layers upon the substrate.

38. The electronic circuit of claim 23, wherein the DC-DC converter comprises a switching regulator.

39. The electronic circuit of claim 38, further comprising:
a semiconductor substrate, wherein the linear regulator comprises a plurality of active electronic components formed upon the semiconductor substrate, wherein the switching regulator comprises a plurality of active electronic components formed upon the semiconductor substrate, and wherein the sensing element is formed upon the semiconductor substrate;

a lead frame coupled to the semiconductor substrate, wherein the lead frame comprises a plurality of leads; and a mold compound encapsulating the semiconductor substrate and covering a portion of the lead frame, wherein the switching regulator comprises a discrete electronic component, wherein discrete electronic component is electrically coupled to the semiconductor substrate and encapsulated by the mold compound.

40. The electronic circuit of claim 39, wherein the discrete electronic component is directly coupled to the lead frame apart from the semiconductor substrate apart from the semiconductor substrate.

41. The electronic circuit of claim 39, wherein the discrete electronic component comprises a discrete capacitor comprising a plurality of layers upon the substrate.

* * * * *